United States Patent
Goda et al.

(10) Patent No.: US 6,828,624 B1
(45) Date of Patent: Dec. 7, 2004

(54) NONVOLATILE SEMICONDUCTOR MEMORY DEVICE COVERED WITH INSULATING FILM WHICH IS HARD FOR AN OXIDIZING AGENT TO PASS THERETHROUGH

(75) Inventors: Akira Goda, Yokohama (JP); Riichiro Shirota, Fujisawa (JP); Kazuhiro Shimizu, Yokohama (JP); Hiroaki Hazama, Hachioji (JP); Hirohisa Iizuka, Yokohama (JP); Seiichi Aritome, Yokohama (JP); Wakako Moriyama, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/556,777

(22) Filed: Apr. 25, 2000

(30) Foreign Application Priority Data

Apr. 26, 1999 (JP) .......................................... 11-118115

(51) Int. Cl.[7] .......................................... H01L 29/792
(52) U.S. Cl. ...................... 257/324; 257/314; 257/315; 257/316; 257/317; 257/325; 257/326; 257/341; 257/368; 257/390; 257/909; 257/640; 257/649
(58) Field of Search .............................. 257/314, 315, 257/316, 317, 324, 325, 326, 341, 368, 390, 909, 640, 649

(56) References Cited

U.S. PATENT DOCUMENTS

| | | | | |
|---|---|---|---|---|
| 4,134,125 A | * | 1/1979 | Adams et al. | 257/640 |
| 4,467,452 A | * | 8/1984 | Saito et al. | 257/314 |
| 4,495,693 A | * | 1/1985 | Iwahashi et al. | 257/316 |
| 4,665,426 A | * | 5/1987 | Allen et al. | 257/649 |
| 4,769,340 A | * | 9/1988 | Chang et al. | 438/257 |
| 4,859,619 A | * | 8/1989 | Wu et al. | 257/316 |
| 4,866,003 A | * | 9/1989 | Yokoi et al. | 257/649 |
| 5,153,144 A | * | 10/1992 | Komori et al. | 257/640 |
| 5,262,985 A | * | 11/1993 | Wada | 257/316 |
| 5,348,898 A | * | 9/1994 | Yatsuda et al. | 438/291 |
| 5,350,701 A | * | 9/1994 | Jaffrezid-Renault et al. | 257/649 |
| 5,405,798 A | * | 4/1995 | Ema | 438/253 |
| 5,479,054 A | * | 12/1995 | Tottori | 257/752 |
| 5,497,018 A | * | 3/1996 | Kajita | 257/316 |
| 5,574,680 A | * | 11/1996 | Kim et al. | 365/149 |
| 5,641,696 A | | 6/1997 | Takeuchi | 438/257 |
| 5,659,191 A | * | 8/1997 | Arima | 257/296 |
| 5,710,075 A | * | 1/1998 | Tseng | 438/254 |
| 5,716,883 A | * | 2/1998 | Tseng | 438/253 |
| 5,731,130 A | * | 3/1998 | Tseng | 438/396 |
| 5,747,370 A | * | 5/1998 | Lee | 438/267 |

(List continued on next page.)

FOREIGN PATENT DOCUMENTS

| | | |
|---|---|---|
| CN | 1111825 A | 11/1995 |
| JP | 6-77497 | 3/1994 |
| JP | 11-74388 | 3/1999 |

*Primary Examiner*—Amir Zarabian
*Assistant Examiner*—Ida M. Soward
(74) *Attorney, Agent, or Firm*—Oblon, Spivak, McClelland, Maier & Neustadt, P.C.

(57) ABSTRACT

A nonvolatile semiconductor memory device includes comprises: an element isolation region being in contact with a first element region, an insulating film covering a memory cell, a peripheral transistor and the element isolation region, an inter-level insulating film provided on the surface of the insulating film, and a contact hole provided in the inter-level insulating film and the insulating film. The inter-level insulating film contains an insulator different from the insulating film. The contact hole reaches at least one of source and drain diffusion layers of the memory cell and overlaps the element isolation region. The insulating film contains an insulator different from the element isolation region and the insulating film is harder for an oxidizing agent to pass therethrough than a silicon oxide film. A surface of the insulating film is oxidized.

28 Claims, 13 Drawing Sheets

U.S. PATENT DOCUMENTS

| | | | |
|---|---|---|---|
| 5,766,996 A | * | 6/1998 | Hayakawa et al. .......... 438/257 |
| 5,767,544 A | * | 6/1998 | Kuroda et al. .............. 257/318 |
| 5,838,041 A | | 11/1998 | Sakagami et al. |
| 5,880,496 A | * | 3/1999 | Chen et al. ................. 257/296 |
| 5,893,741 A | * | 4/1999 | Huang ........................ 438/300 |
| 5,925,908 A | | 7/1999 | Dahl et al. |
| 5,925,918 A | | 7/1999 | Wu et al. |
| 5,945,715 A | * | 8/1999 | Kuriyama ................... 257/369 |
| 5,990,524 A | | 11/1999 | En et al. |
| 6,034,416 A | * | 3/2000 | Uehara et al. .............. 257/623 |
| 6,043,118 A | * | 3/2000 | Suwanai et al. ............ 438/253 |
| 6,133,619 A | | 10/2000 | Sahota et al. |
| 6,143,601 A | * | 11/2000 | Sun ............................. 438/253 |
| 6,165,867 A | * | 12/2000 | Tu et al. ...................... 438/399 |
| 6,211,548 B1 | * | 4/2001 | Ma ............................. 257/321 |
| 6,228,714 B1 | * | 5/2001 | Choi ........................... 438/258 |
| 6,483,172 B1 | | 11/2002 | Cote et al. |
| 6,498,097 B1 | * | 12/2002 | Park et al. ................... 438/686 |
| 6,501,127 B2 | * | 12/2002 | Mori ........................... 257/321 |
| 2001/0002711 A1 | * | 6/2001 | Gonzalez ..................... 257/311 |
| 2001/0038137 A1 | * | 11/2001 | Akram ........................ 257/513 |
| 2002/0003288 A1 | * | 1/2002 | Saitou et al. ................. 257/460 |
| 2002/0009837 A1 | * | 1/2002 | Iwamatsu et al. ........... 438/151 |
| 2002/0031870 A1 | * | 3/2002 | Bryant ........................ 438/142 |

* cited by examiner

| | CONCENTRATION OF HYDROGEN IN SiN FILM | CONCENTRATION OF HYDROGEN IN TUNNEL OXIDE FILM | dVg (ELECTRON AMOUNT TRAP) |
|---|---|---|---|
| NO SURFACE OXIDE FILM | $4.0 \times 10^{21}$ atom/cm$^3$ | 1 | 512mV |
| SURFACE OXIDE FILM FORMED | $1.6 \times 10^{21}$ atom/cm$^3$ | 0.2 | 398mV |
FIG. 15
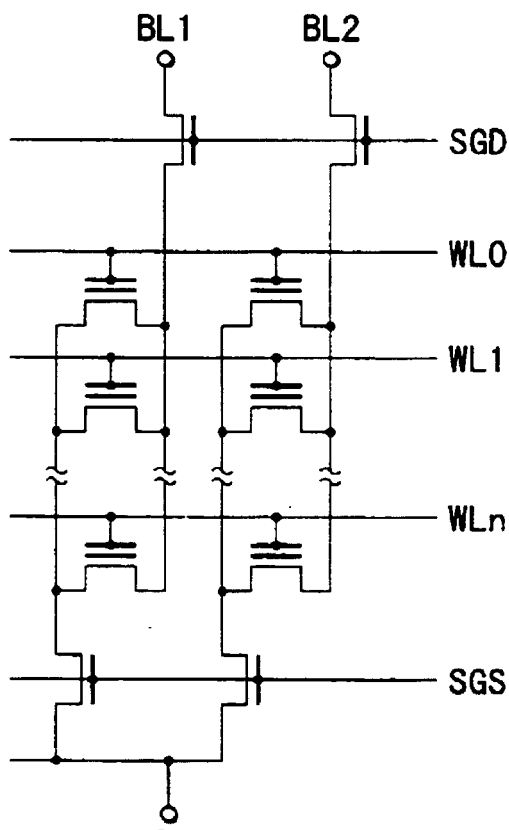
FIG. 16A
AND EEPROM
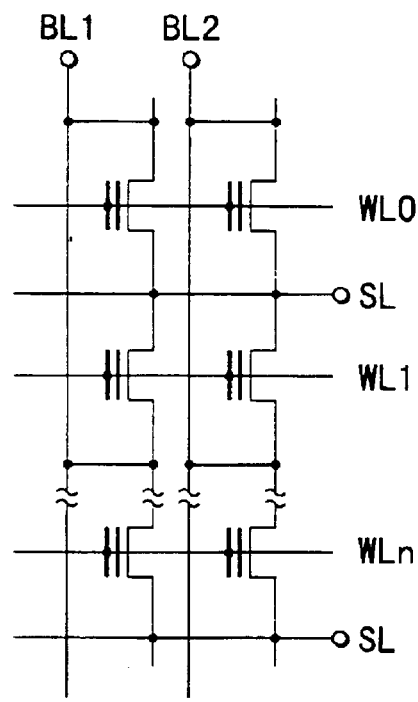
FIG. 16B
NOR EEPROM

NONVOLATILE SEMICONDUCTOR MEMORY DEVICE COVERED WITH INSULATING FILM WHICH IS HARD FOR AN OXIDIZING AGENT TO PASS THERETHROUGH

CROSS-REFERENCE TO RELATED APPLICATIONS

This application is based upon and claims the benefit of priority from the prior Japanese Patent Application No. 11-118115, filed Apr. 26, 1999, the entire contents of which are incorporated herein by reference.

BACKGROUND OF THE INVENTION

This invention relates to a nonvolatile semiconductor memory device and a method for manufacturing the same.

As is well known in the art, a semiconductor memory has cell transistors and peripheral transistors formed on the same substrate. As one example thereof, an electrically erasable and programmable read only memory in which data erasing and programming can be electrically effected is well known.

FIG. 1 shows an EEPROM. That is, FIG. 1 schematically shows the construction of cell transistors (including selection gate transistors) and peripheral transistors of a conventional NAND type EEPROM.

The construction of the cell transistor and peripheral transistor of the NAND type EEPROM is explained below according to the manufacturing process thereof.

FIGS. 2A to 2D show the manufacturing process of the cell transistors and peripheral transistors of the conventional NAND type EEPROM.

First, as shown in FIG. 2A, for example, after a well region and element isolation region (neither of them is shown in the drawing) are formed in the surface area of a silicon substrate 101, a thermal oxidation film 102 used as a gate insulating film or tunnel oxide film is formed on the well region.

Then, in the memory cell region, gate electrodes 103 of stacked gate structure are formed on the thermal oxidation film (tunnel oxide film) 102 and, in the peripheral circuit region, gate electrodes 104 of single-layered structure are formed on the thermal oxide film (gate insulating film) 102.

The gate electrode 103 in the memory cell region has a well known structure in which, for example, a control gate electrode 103c is stacked on a floating gate 103a used as a charge storing layer while an ONO film (oxide film/nitride film/oxide film) 103b used as an inter-gate insulating film is disposed therebetween.

Next, as shown in FIG. 2B, post-oxidation films 105 for restoring the gate electrodes 103, 104 from the processing damage are formed.

Then, as shown in FIG. 2C, impurity 106 is implanted to form source and drain diffusion regions of the respective transistors.

After this, as shown in FIG. 2D, the implanted impurity 106 is activated by annealing and driven towards the channel region side to form source and drain diffusion layers 106'.

Next, after an inter-level insulating film 107 is formed on the structure, contacts 108 and inter-connection layers 109 connected to the electrodes 104 and contacts 110 and bit lines 111 connected to the source/drain diffusion layers 106' are formed to form the cell transistors and peripheral transistors of the structure shown in FIG. 1.

However, if the conventional cell transistors and peripheral transistors are formed as described above, the length of the overlap area of the source/drain diffusion layer 106' over the gate electrode 103 or 104 varies depending on the condition of the annealing process effected after the impurity 106 is implanted.

For example, if the annealing process is not sufficiently effected and the source/drain diffusion layer 106' does not overlap and is offset from the gate electrode 103 or 104, the offset portion acts as a parasitic resistor to prevent a sufficiently large drain current from flowing in the device.

On the other hand, if the annealing process is excessively effected and the source/drain diffusion layer 106' extends deeply into the channel region, the short channel effect becomes significant and the source-drain withstand voltage is lowered, thereby degrading the device characteristic.

Generally, the gate length in the memory cell is shorter than that in the peripheral transistor. Therefore, the short channel effect in the memory cell tends to become more noticeable. That is, if the annealing process is sufficiently effected for the peripheral transistor, there occurs a possibility that punch through may occur in the cell transistor and selection transistor.

In the case of NAND type EEPROM, since the source and drain diffusion layers 106' of the memory cells are satisfactory if they can electrically connect the cells which are serially arranged, it is not necessary to overlap the source/drain diffusion layer 106' over the gate electrode 103. That is, it can be the that the annealing process after the impurity 106 is implanted is effected to the least possible degree from the viewpoint of the characteristic of the cell transistor and selection transistor.

Further, in the case of the post-oxidation amount after the gate processing, the post-oxidation for sufficiently compensating for the processing damage is necessary, but the post-oxidation increases the bird's beak amount. In a case where the memory cell has a short gate, an increase in the bird' beak amount by the post-oxidation (refer to a portion A in FIG. 1, for example) lowers the coupling ratio, degrades the programming and erasing characteristics and is not preferable.

In the case of the peripheral transistor, since the gate is relatively long, it is permitted to sufficiently effect the post-oxidation (refer to a portion B in FIG. 1, for example).

Thus, since the NAND type EEPROM includes transistors having different gate lengths and the post-oxidation amount and the most suitable annealing condition for impurity diffusion are different depending on the gate lengths of the transistors, the difference causes a main factor which lowers the process margin.

BRIEF SUMMARY OF THE INVENTION

A nonvolatile semiconductor memory device comprises: a semiconductor substrate having a peripheral circuit region and a memory cell region; a first element region provided in the memory cell region; a second element region provided in the peripheral circuit region; a memory cell having source and drain diffusion layers each provided in the first element region; a peripheral transistor having source and drain diffusion layers each provided in the second element region; an element isolation region being in contact with the first element region; an insulating film covering the memory cell, the peripheral transistor and the element isolation region and containing an insulator different from the element isolation region, the insulating film being harder for an oxidizing agent to pass therethrough, compared with a silicon oxide film, and a surface of the insulating film being oxidized; an inter-level insulating film provided on the surface of the insulating film, the inter-level insulating film containing an insulator different from the insulating film; a contact hole provided in the inter-level insulating film and the insulating film, the contact hole reaching at least one of the source and drain diffusion layers of the memory cell and overlapping the element isolation region; and a contact plug provided in the contact hole, the contact plug being in contact with at least one of the source and drain diffusion layers of the memory cell, the insulating film and the inter-level insulating film.

BRIEF DESCRIPTION OF THE SEVERAL VIEWS OF THE DRAWING

FIG. 15 is a diagram showing the characteristic of the NAND type EEPROM according to the second embodiment of this invention in comparison with the characteristic of the conventional NAND type EEPROM;

FIG. 16A is a circuit diagram showing an equivalent circuit of an AND type EEPROM; and FIG. 16B is a circuit diagram showing an equivalent circuit of a NOR type EEPROM.

DETAILED DESCRIPTION OF THE INVENTION

There will now be described embodiments of this invention with reference to the accompanying drawings. In the present embodiments, for example, a NAND type EEPROM is used as a nonvolatile semiconductor memory device.

(First Embodiment)

Figure 1:
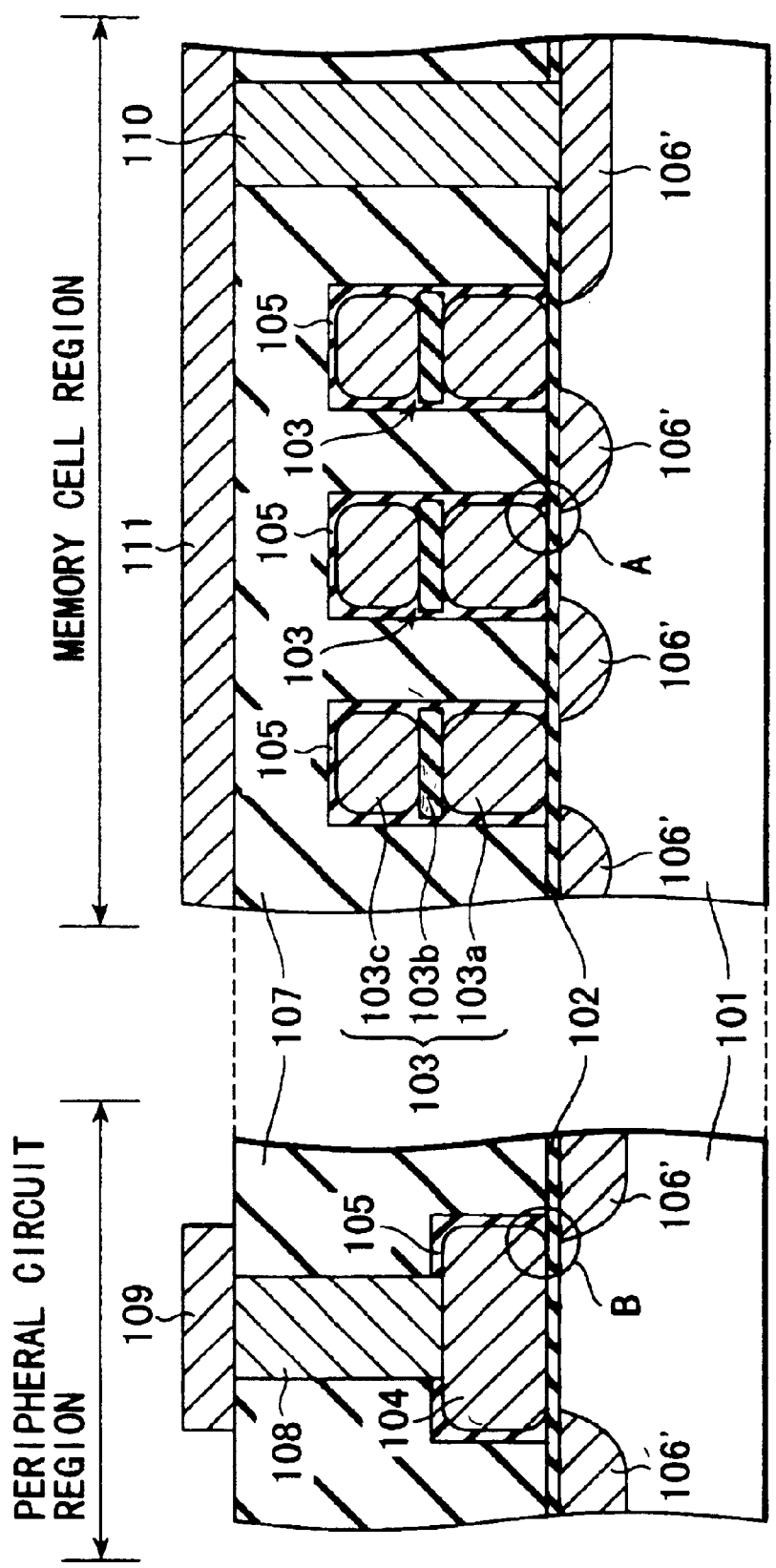
FIG. 1 is a cross sectional view showing a conventional NAND type EEPROM.
Figure 2A:
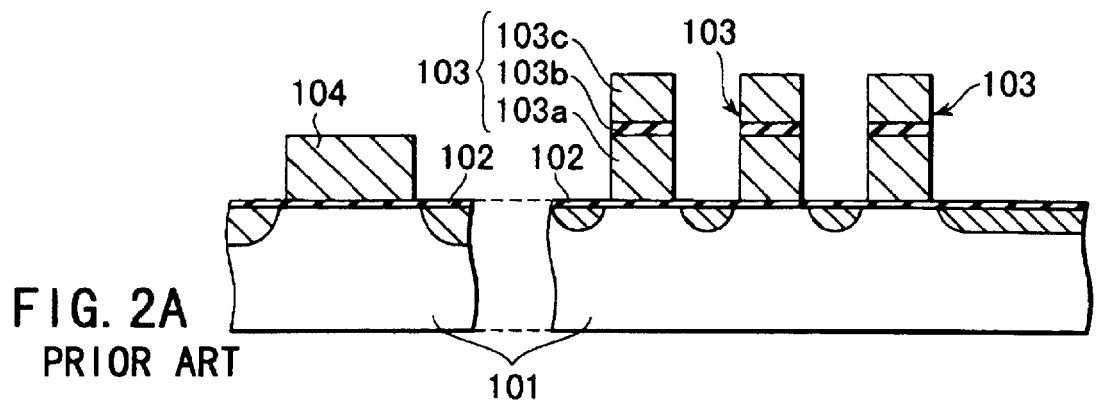
FIGS. 2A, 2B, 2C and 2D are cross sectional views showing the conventional NAND type EEPROM in the respective main manufacturing steps.
Figure 2B:
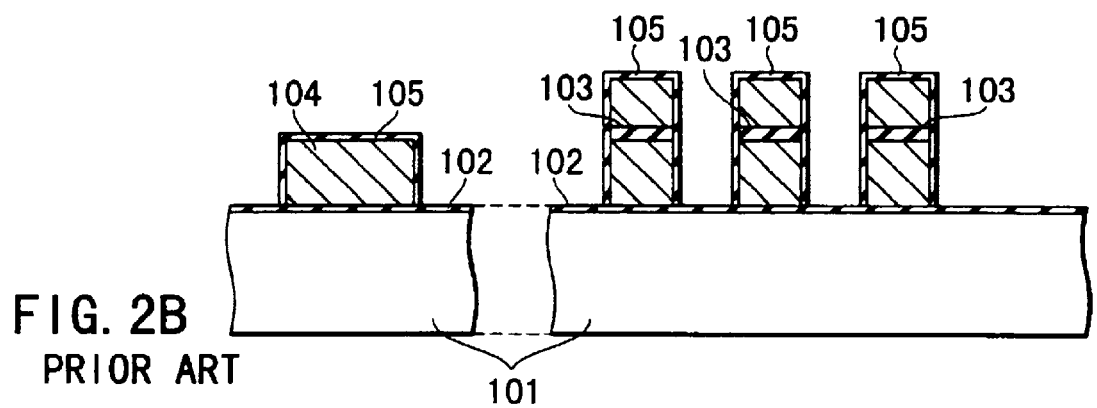
Figure 2C:
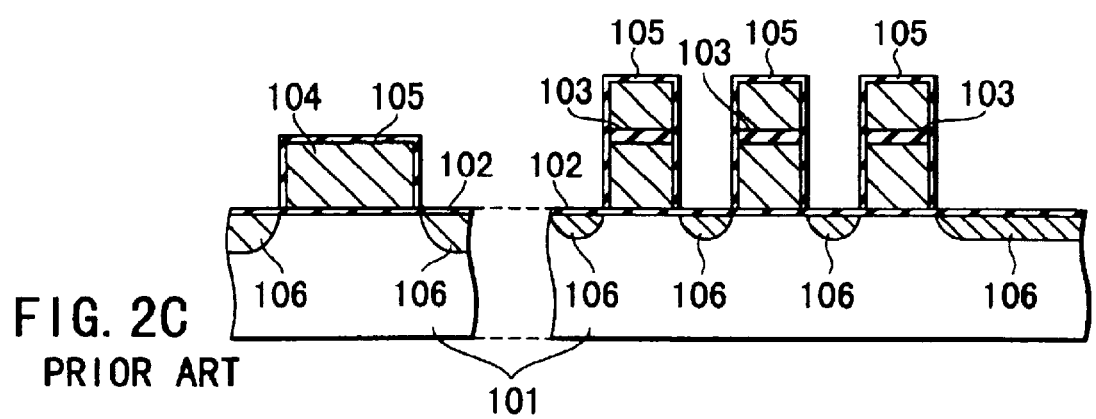
Figure 2D:
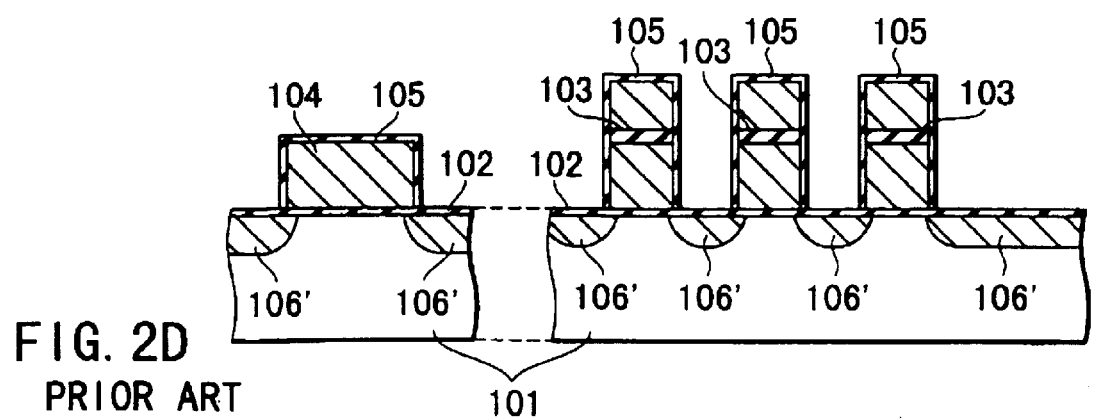
Figure 3A:
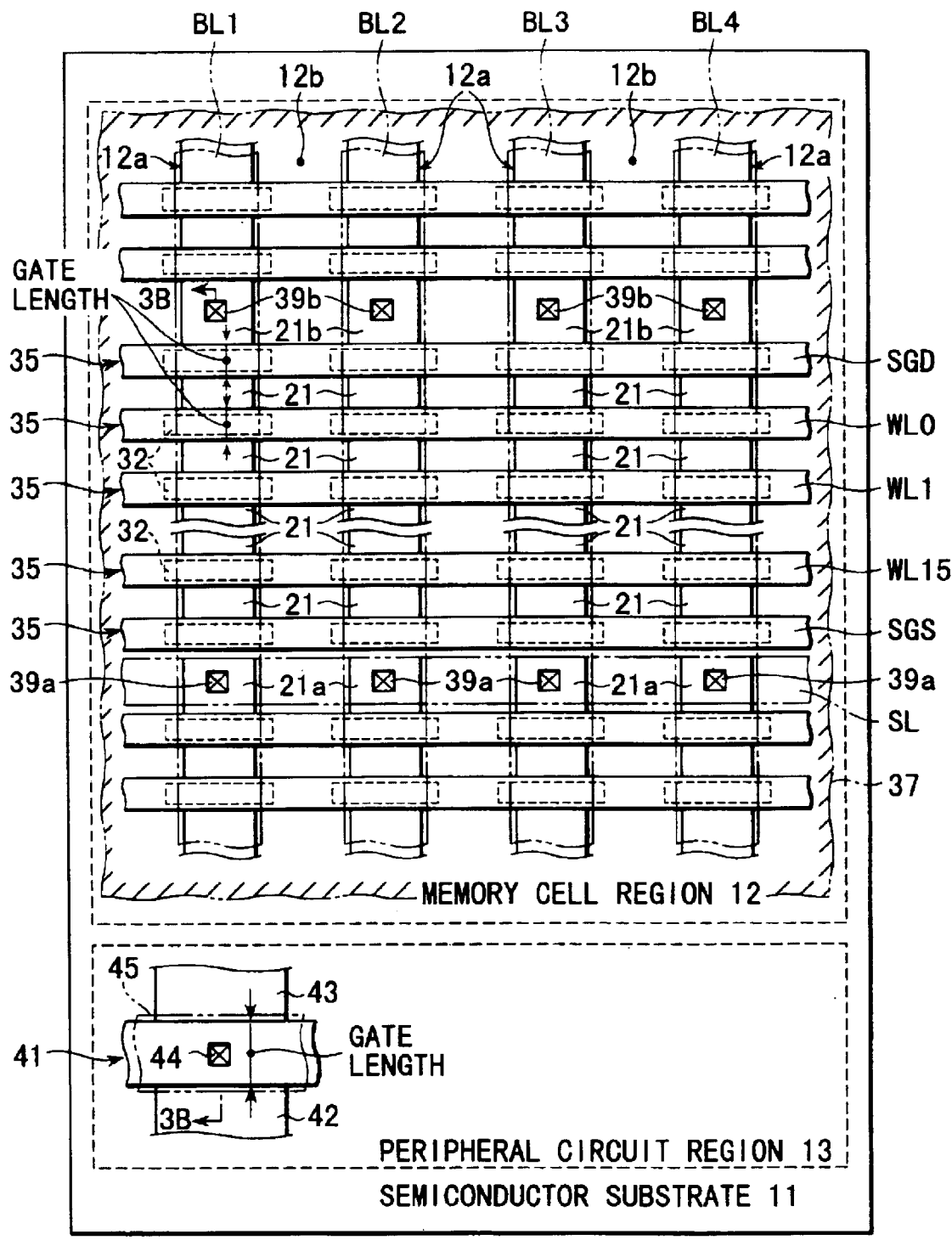
FIG. 3A is a plan view showing a NAND type EEPROM according to a first embodiment of this invention.
Figure 3B:
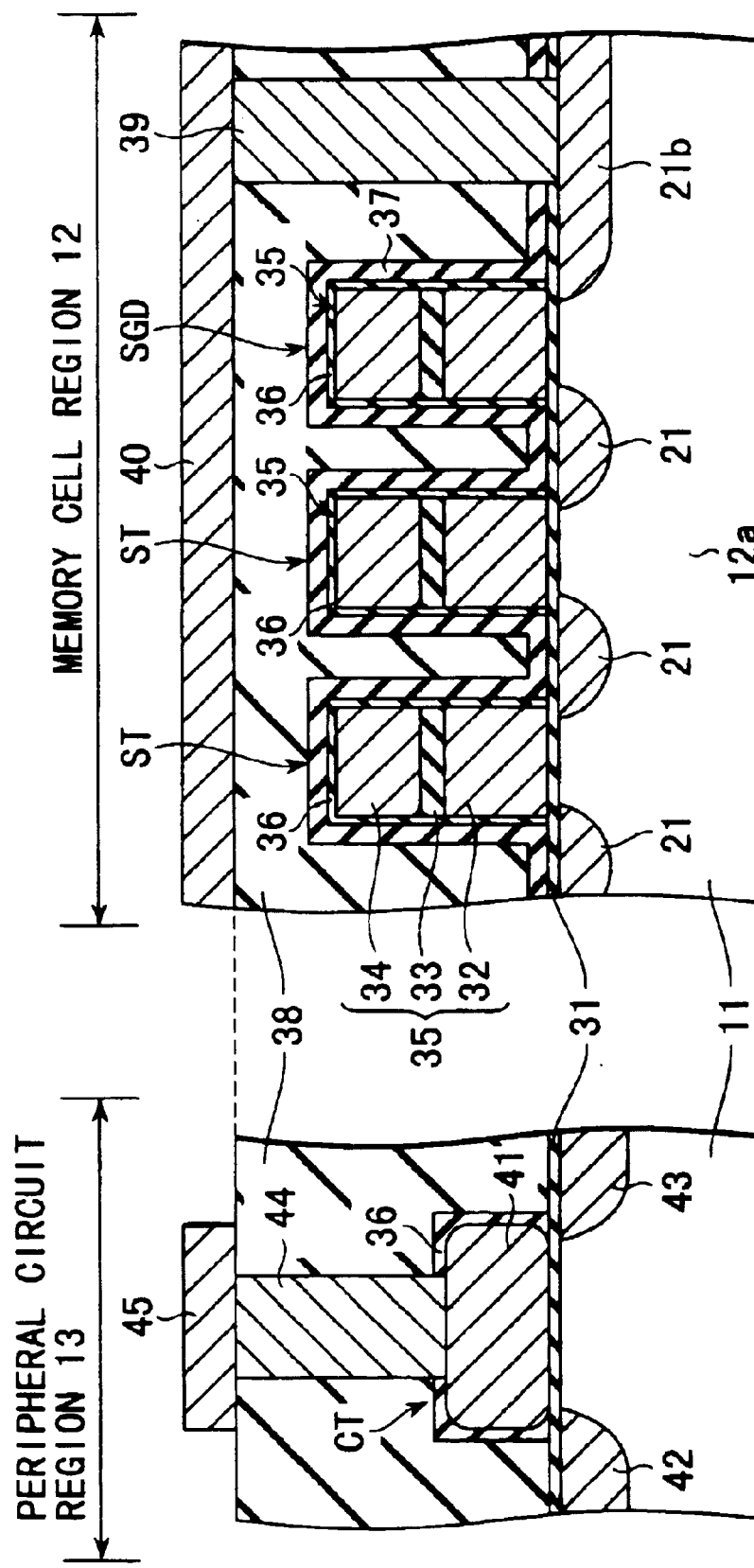
FIG. 3B is a cross sectional view taken along the 3B—3B line of FIG. 3A.

FIG. 3A is a plan view showing the schematic construction of a NAND type EEPROM according to a first embodiment of this invention and FIG. 3B is a cross sectional view taken along the 3B—3B line of FIG. 3A.

As shown in FIGS. 3A, 3B, the NAND type EEPROM has a memory cell region (cell array) 12 and peripheral circuit region 13 formed on a silicon substrate 11, for example.

In the memory cell region 12, memory cell transistors, selection gate transistors and the like are formed. In this embodiment, transistors formed in the memory cell region 12 are generally called cell transistors.

Further, in the peripheral circuit region 13, transistors constituting a memory core circuit including a row decoder, column decoder, sense amplifiers and the like and transistors constituting an I/O circuit are formed. In this embodiment, transistors formed in the peripheral circuit region 13 are generally called peripheral transistors.

An element isolation region 12b is formed on the surface of the silicon substrate 11 in the memory cell region 12. The element isolation regions 12b separate a plurality of stripe-form element regions 12a formed in the memory cell region 12 and extending in the column direction. In the element regions 12a, for example, the surface of a p-type well region formed on the silicon substrate 11 is exposed.

In part of the element regions 12a, n-type source diffusion layers 21a are formed, and in another part of the element regions 12a, n-type drain diffusion layers 21b are formed. Between the source diffusion layer 21a and the drain diffusion layer 21b, eighteen cell transistors are formed. The eighteen cell transistors are serially connected.

The cell transistor among the eighteen cell transistors which is connected to the source diffusion layer 21a is a source side selection gate transistor SGS and the cell transistor connected to the drain diffusion layer 21b is a drain side selection gate transistor SGD. The remaining sixteen cell transistors except the above two cell transistors are memory cell transistors ST. The sixteen memory cell transistors ST serially connected to one another constitute one unit cell (NAND cell).

Each of the memory cell transistors ST includes a gate oxide film 31, gate electrode 35 and source and drain diffusion layers 21 formed in the element region 12a.

The gate electrode 35 of the memory cell transistor ST of this example has a stacked gate structure. The stacked gate structure is constructed by a floating gate 32 formed on the gate oxide film 31, an inter-gate insulating film 33 formed on the floating gate 32, and a control gate 34 formed on the inter-gate insulating film 33. For example, the gate oxide film 31 is formed by oxidizing the surface of the substrate 11 which is exposed in the element region 12a. In a NAND type EEPROM using a tunnel current at the data programming/erasing, the gate oxide film 31 is also called a tunnel oxide film. The floating gate 32 stores charges (generally, electrons) to control the threshold voltage of the memory cell transistor ST and is also called a charge storage layer. The inter-gate insulating film 33 isolates the floating gate 32 and control gate 34 from each other and is formed of a silicon oxide film/silicon nitride film/silicon oxide film (ONO film), for example. The control gates 34 on the same row are connected to a corresponding one of word lines WL0 to WL15 for selecting the row of the cell array.

The drain side selection gate transistor SGD of this example has substantially the same structure as the memory cell transistor ST except that one of the source and drain diffusion layers 21 is formed of the drain diffusion layer 21b.

Likewise, the source side selection gate transistor SGS of this example has substantially the same structure as the memory cell transistor ST except that one of the source and drain diffusion layers 21 is formed of the source diffusion layer 21a.

The outer surface of the gate electrode 35 is covered with a first insulating film 37 formed of a silicon nitride (SiN) film with a post-oxidation film 36 disposed therebetween. That is, the first insulating film 37 is selectively formed only on the memory cell region 12 so as to cover all of the cell transistors ST, SGS, SGD.

An inter-level insulating film 38 is formed on the first insulating film 37. In the inter-level insulating film 38, contacts 39b and 39a passing through a thermal oxide film (in this example, which is formed of the same thermal oxide film as the gate oxide film 31) formed on the element regions 12a and the first insulating film 37 and respectively reaching the drain diffusion layers 21b and source diffusion layers 21a are formed.

Figure 4:
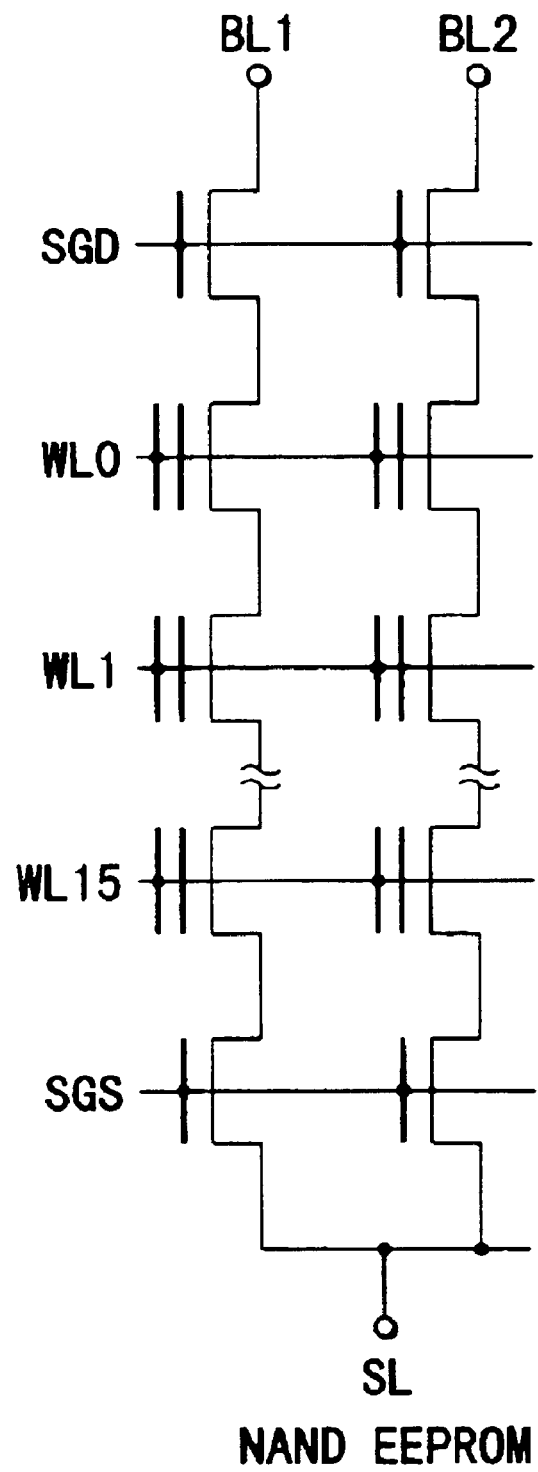
FIG. 4 is a circuit diagram showing an equivalent circuit of the NAND type EEPROM.

On the inter-level insulating film 38, bit lines (BL1, BL2, . . . ) 40 connected to the drain diffusion layers 21b via the contacts 39b are formed in the column direction. In the inter-level insulating film 38, source lines (SL) connected to the source diffusion layers 21a via the contacts 39a are formed in a row direction perpendicular to the column direction. Thus, a memory cell array of the NAND type EEPROM shown in FIG. 4 is constructed.

As shown in FIG. 3B, each of the peripheral transistors CT formed in the peripheral circuit region 13 includes a gate oxide film 31, gate electrode 41 and source/drain diffusion layers 42, 43.

The gate electrode 41 of the peripheral transistor CT of this example has a gate length larger than that of the gate electrode 35 of the cell transistors ST, SGD, SGS. The structure thereof is not the stacked gate structure but is a general gate structure having a single-layered gate electrode. The general gate structure is hereinafter referred to as a single-gate structure for convenience in this specification.

Further, the outer surface of the gate electrode 41 is covered with only a post-oxidation film 36.

An inter-level insulating film 38 is formed on the post-oxidation film 36. Contacts 44 each passing through the post-oxidation film 36 and reaching the gate electrode 41 are formed in the inter-level insulating film 38.

Interconnection layers 45 each connected to a corresponding one of the gate electrodes 41 via the contact 44 are formed on the inter-level insulating film 38.

Next, one example of a manufacturing method of the NAND type EEPROM according to the first embodiment is explained.

FIGS. 5A, 5B, 5C and 5D are cross sectional views showing the NAND type EEPROM according to the first embodiment of this invention in the respective main manufacturing steps.

Figure 5A:
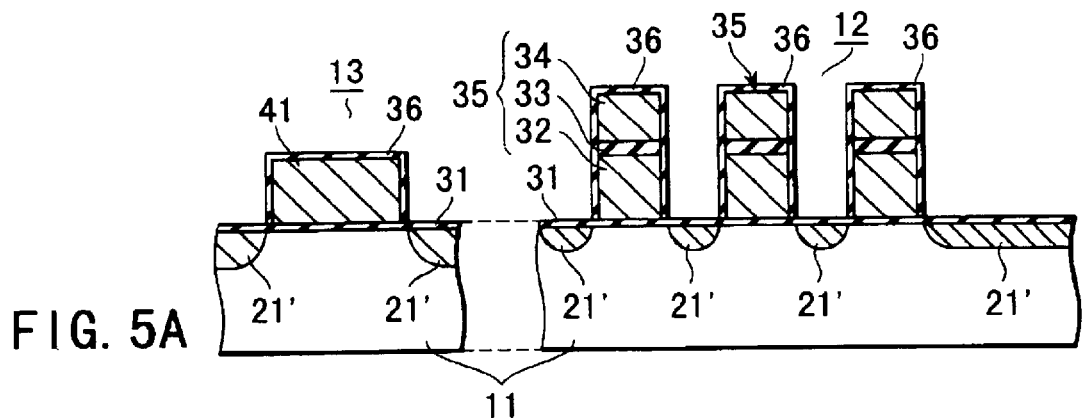
FIGS. 5A, 5B, 5C and 5D are cross sectional views showing the NAND type EEPROM according to the first embodiment of this invention in the respective main manufacturing steps.

First, as shown in FIG. 5A, an element isolation region 12b is formed on the surface of a silicon substrate 11 to isolate element regions 12a. Since the cross section of FIG. 5A is taken along the element region 12a, the element isolation region 12b is not shown in FIG. 5A. Then, a portion of the substrate 11 (or well region) exposed in the element region 12a is subjected to the thermal oxidation process to form a thermal oxidation film. The thermal oxidation film is used as a gate insulating film 31. Next, gate electrodes 35 of stacked gate structure are formed on the gate oxide film 31 in the memory cell region 12 and gate electrodes 41 of single-gate structure are formed on the gate oxide film 31 in the peripheral circuit region 13. The above gate electrodes are both formed to cross the element regions 12a, for example. The gate electrodes 35 of stacked gate structure can be formed by use of a well known method. As one example of the method, a method for forming a floating gate 32 on the gate oxide film 31, forming an inter-gate insulating film 33 on the floating gate 32 and forming a control gate 34 on the inter-gate insulating film 33 is given. After this, the surfaces of the gate electrodes 35, 41 are subjected to the oxidation process. The oxidation process is effected to compensate for the processing damage of the gate electrodes 35, 41. As a result, post-oxidation films 36 are formed on the surfaces of the gate electrodes 35, 41. Then, impurity 21' is ion-implanted into the element regions 12a with the gate electrodes 35, 41 and element isolation region 12b used as a mask. The impurity 21' is ion-implanted to form diffusion layers 21, 21a, 21b, 42, 43 of transistors (ST, SGS, SGD, CT).

Figure 5B:
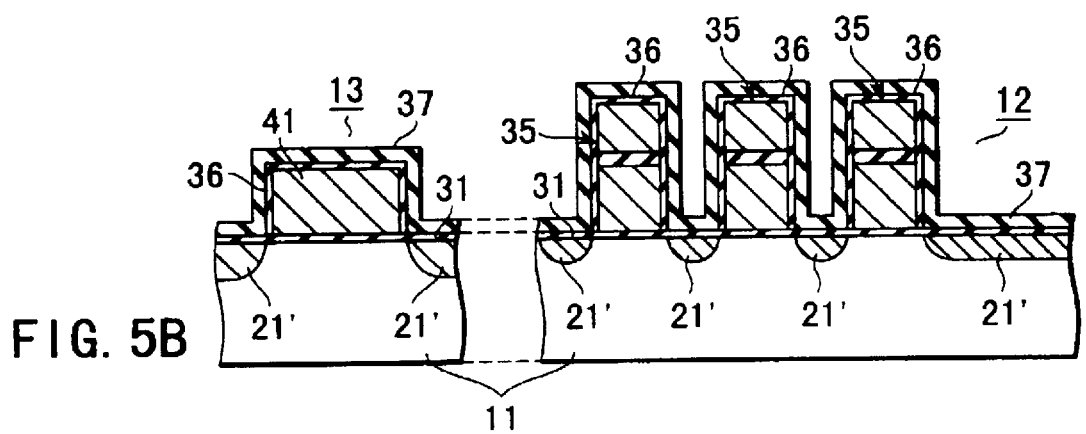

Next, as shown in FIG. 5B, a first insulating film 37 formed of a silicon nitride film is deposited on the structure shown in FIG. 5A. The first insulating film 37 is not limited to the silicon nitride film and a film which makes it difficult for an oxidizing agent (oxidizing seed) to pass therethrough at the later annealing time in an oxidation atmosphere may be used.

Figure 5C:
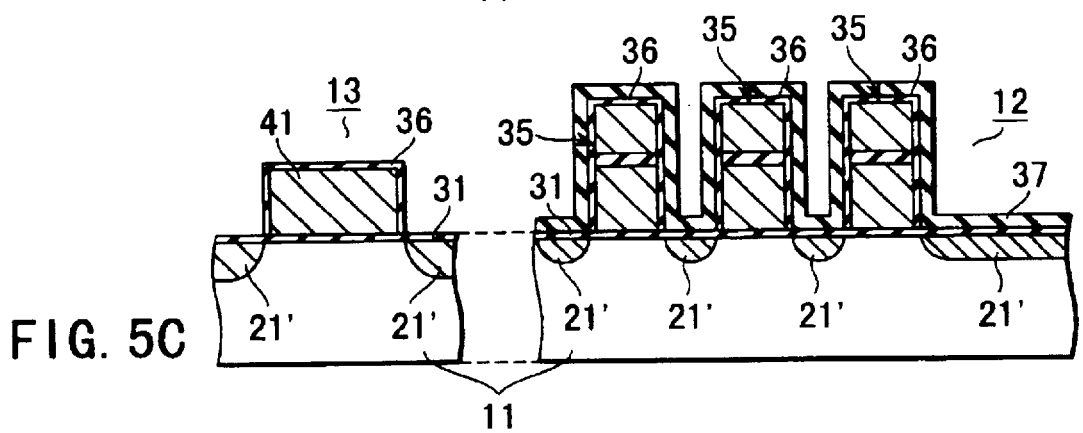

After this, as shown in FIG. 5C, the first insulating film 37 formed on the peripheral circuit region 13 is removed. When the above removing process is effected, a photoresist pattern covering the memory cell region 12 or a photoresist pattern having an window corresponding to the peripheral circuit region 13 is formed by use of the photolithography technology, for example. Then, the first insulating film 37 may be removed by effecting a CDE (Chemical Dry Etching) method using the above photoresist pattern as a mask.

Figure 5D:
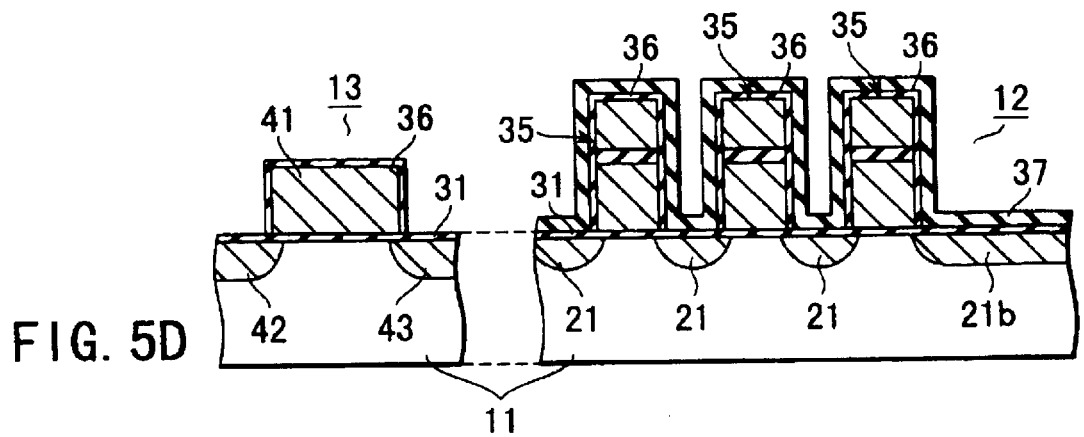

Next, as shown in FIG. 5D, the doped impurity 21' is activated by annealing in the oxidation atmosphere. As a result, the doped impurity 21' is diffused in the depth direction of the substrate 11 and in the lateral direction towards a portion below each of the gate electrodes 35, 41. Thus, diffusion layers 21, 21a, 21b, 42, 43 are formed.

As described above, the structure having the memory cell region 12 covered with the first insulating film 37, that is, the structure shown in FIG. 5C is subjected to the annealing process in the oxidation atmosphere. At this time, since the first insulating film 37 is not formed on the surface of the peripheral circuit region 13, a larger amount of oxidizing agent reaches the silicon substrate 11 in the peripheral circuit region 13 than in the memory cell region 12. Therefore, the diffusion speed of the impurity 21' in the peripheral circuit region 13 is increased so that the source/drain diffusion layers 42, 43 will sufficiently overlap the gate electrode 41.

Since the memory cell region 12 is covered with the first insulating film 37, almost no oxidizing agent reaches the silicon substrate 11 in the memory cell region 12 even if the structure is subjected to the annealing process in the oxidation atmosphere. Therefore, the impurity 21' is not so diffused as in the peripheral transistor CT, thereby making it possible to suppress the short channel effect.

In a case where tungsten silicide (WSi) is used for the control gate 34, it is considered that abnormal oxidation of WSi will occur due to the annealing process effected in the oxidation atmosphere. The abnormal oxidation of WSi tends to occur in a portion where the gate length of the cell transistor ST is small, for example.

However, in the first embodiment in which the memory cell region 12 is covered with the first insulating film 37, the abnormal oxidation of WSi can be suppressed even if WSi is used for the control gate 34 since the oxidizing agent can be suppressed from reaching the gate electrode 35.

Further, the bird' beak amount for the gate insulating film 31 in the memory cell region 12 and the post oxidation amount on the side wall of the gate electrode 35 can be reduced by leaving the first insulating film 37 on the memory cell region 12 in comparison with a case where the first insulating film 37 is removed. Reductions in the bird's beak amount and post oxidation amount are particularly effective for suppressing a lowering in the ratio (coupling ratio) of the capacitance between the control gate 34 and the floating gate 32 to the capacitance between the floating gate 32 and the substrate 11.

The post oxidation amount can be changed according to formation/non-formation of the first insulating film 37 for the peripheral transistor CT for which it is desired to sufficiently effect the post oxidation so as to compensate for the processing damage and for the cell transistors ST, SGS, SGD for which it is not desired to excessively effect the post oxidation.

Next, after an inter-level insulating film 38 is formed on the structure shown in FIG. 5D, contacts 44 and interconnection layers 45 connected to the gate electrodes 41 are formed, bit lines 40 and contacts 39b connected to the drain diffusion layers 21b are formed and source lines and contacts 39a connected to the source diffusion layers 21a are formed. As a result, a NAND type EEPROM of a structure shown in FIGS. 3A, 3B is completed.

In the first embodiment, the peripheral circuit region 13 can be selectively subjected to the oxidation process.

That is, the annealing process is effected in the oxidation atmosphere with the memory cell region 12 covered with the first insulating film 37. Therefore, even in a case where the gate lengths of transistors are different, it is possible to simultaneously satisfy the annealing condition for impurity diffusion and the post oxidation amount. As a result, reductions in the process margin due to a difference in the optimum annealing condition for impurity diffusion and the post oxidation amount depending on the gate lengths of the transistors can be suppressed and this invention is extremely useful for attaining the high performance of the device.

(First Modification of First Embodiment)

Figure 6:
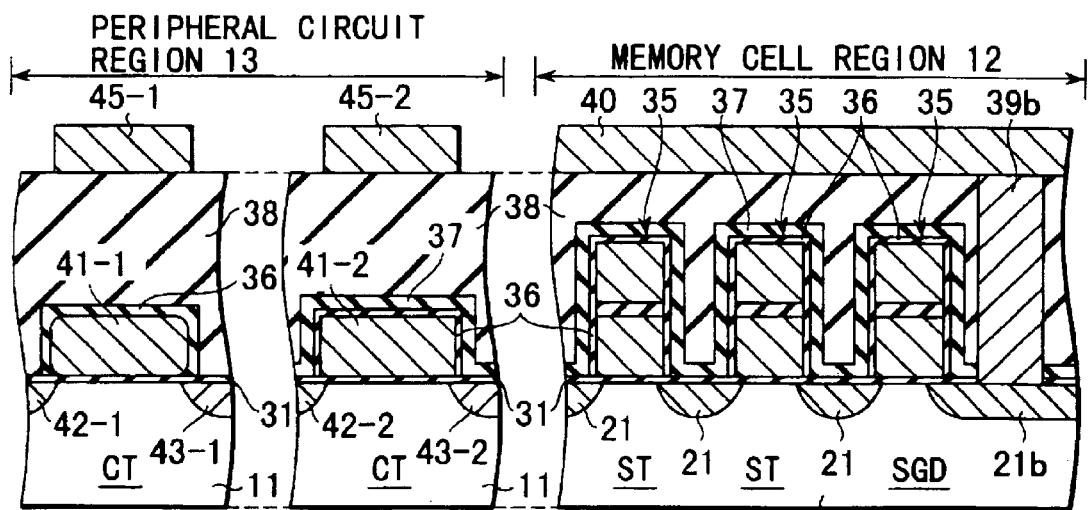
FIG. 6 is a cross sectional view showing a first modification of the NAND type EEPROM according to the first embodiment of this invention.

FIG. 6 is a cross sectional view showing a first modification of the NAND type EEPROM according to the first embodiment of this invention.

As shown in FIG. 6, when the first insulating film 37 is removed, it is not necessary to remove the first insulating film for all of the peripheral transistors CT. That is, the first insulating film 37 may be removed only for the peripheral transistors CT in which it is desired to cause source/drain layers 42-1, 43-1 to sufficiently overlap a gate electrode 41-1 or the peripheral transistors CT in which it is desired to sufficiently effect the post-oxidation process.

(Second Modification of First Embodiment)

Figure 7:
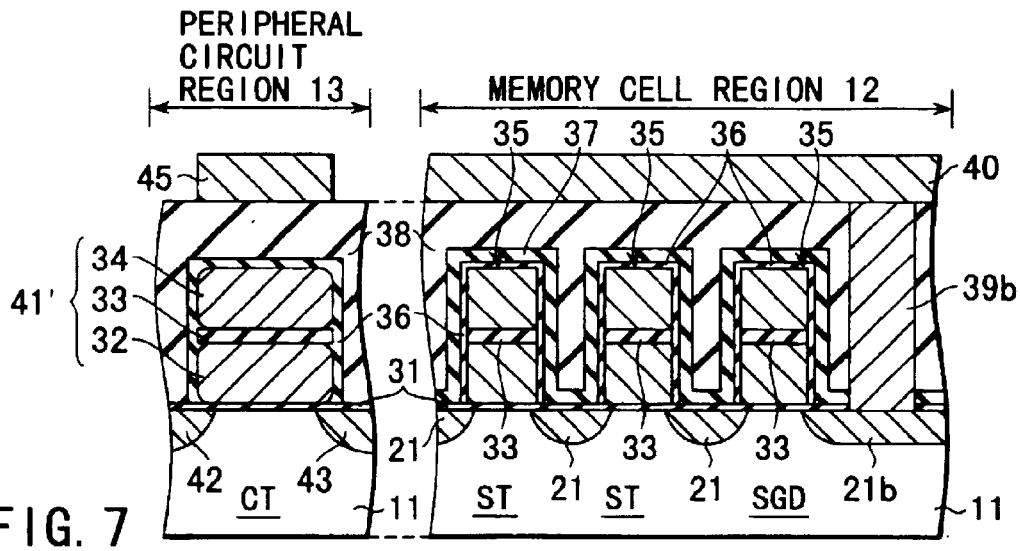
FIG. 7 is a cross sectional view showing a second modification of the NAND type EEPROM according to the first embodiment of this invention.

FIG. 7 is a cross sectional view showing a second modification of the NAND type EEPROM according to the first embodiment of this invention.

As shown in FIG. 7, like the structure of the gate electrode 35 of the cell transistor (ST, SGD, SGS), a gate electrode 41' of each of the peripheral transistors CT can be formed with a stacked gate structure. In this case, it is sufficient if the interconnection layer 45 is electrically connected to at least the first-layered gate electrode 32 as is well known in the art.

Further, in the second modification, an inter-gate insulating film 33 can be formed in the gate electrode 41' of the peripheral transistor CT. Therefore, the bird's beak amount for the inter-gate insulating film 33 can be made different in an area where the first insulating film 37 is left behind and in an area where it is removed.

(Third Modification of First Embodiment)

Figure 8:
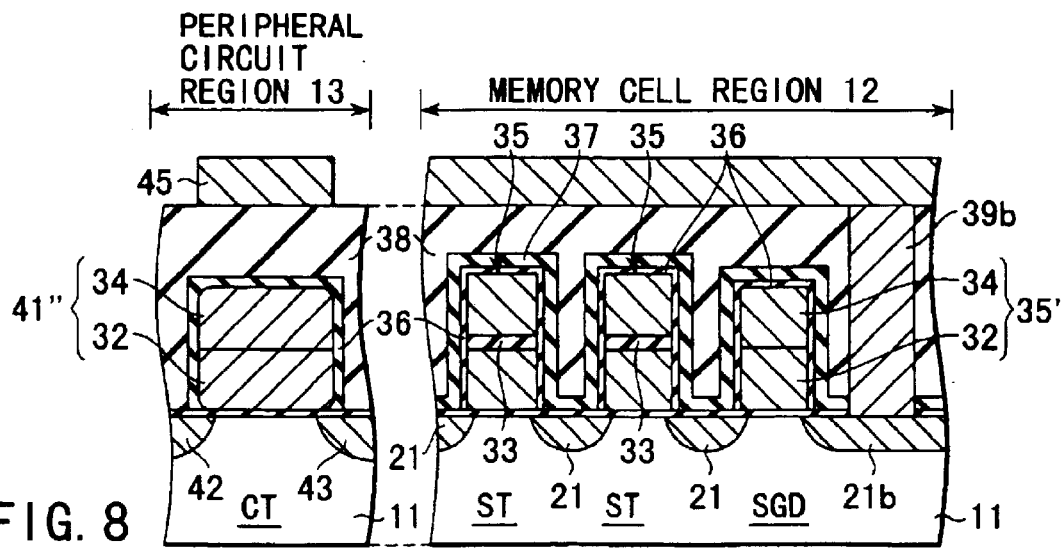
FIG. 8 is a cross sectional view showing a third modification of the NAND type EEPROM according to the first embodiment of this invention.

FIG. 8 is a cross sectional view showing a third modification of the NAND type EEPROM according to the first embodiment of this invention.

As shown in FIG. 8, a gate electrode 35' of the selection gate transistor SGD (SGS) can be formed with a structure different from the structure of the gate electrode 35 of the memory cell transistor ST.

In this example, the inter-gate insulating film 33 is removed from the gate electrode 35' of the selection gate transistor SGD.

A gate electrode 41" of the peripheral transistor CT can also be formed with the same structure as the gate electrode 35' of the selection gate transistor SGD.

(Fourth Modification of First Embodiment)

Figure 9A:
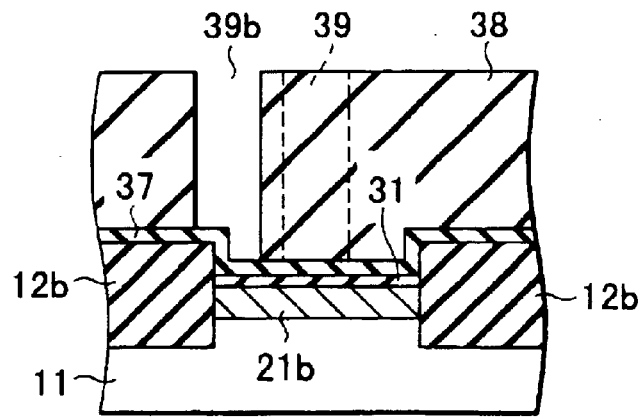
FIGS. 9A and 9B are cross sectional views each showing one example of formation of a contact hole.
Figure 9B:
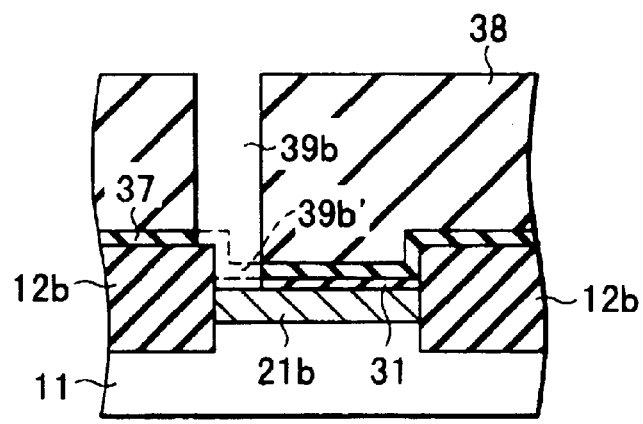

FIGS. 9A and 9B are cross sectional views showing one example of formation of contact hole.

As shown in FIG. 9A, in the NAND type EEPROM according to this invention, the first insulating film 37 is formed on the element isolation region 12b and diffusion layer 21b. In this case, a material constituting the inter-level insulating film 38 and a material constituting the first insulating film 37 are made different from each other. Further, as an etchant used for an RIE (Reactive Ion Etching) process for forming a contact hole 39b, an etchant which easily etches the inter-level insulating film 38 and is difficult to etch the first insulating film 37 is used. Thus, the etching process can be temporarily stopped at the first insulating film 37.

By thus temporarily stopping the etching process at the first insulating film 37, the etching process is suppressed from acting on the element isolation region 12b even if the formation position of the contact hole 39b extends over the element isolation region 12b because of the misalignment of the mask, for example.

After the first contact hole 39b is formed in the inter-level insulating film 38, as shown in FIG. 9B, an etchant used for the RIE (Reactive Ion Etching) process is changed to an etchant which easily etches the first insulating film 37 and is difficult to etch the element isolation region 12b. Then, the first insulating film 37 is etched to form a second contact hole 39b' in the first insulating film 37. As a result, the contact holes 39b, 39b', reaching the drain diffusion layer 21b, for example, are formed in the inter-level insulating film 38.

With the above contact forming method, the etching process is suppressed from acting on the element isolation region 12b even if the formation position of the contact hole 39b extends over the element isolation region 12b.

Therefore, it is prevented that the element isolation region 12b is etched and a hole exceeding over the pn junction between the diffusion layer 21b and the substrate 11 is formed. If the above hole is formed, for example, the bit line BL extends over the diffusion layer 21b and is brought into contact with the substrate 11. As a result, a junction leak will increase.

However, in the EEPROM according to this invention, the etching process can be suppressed from acting on the element isolation region 12b even if the formation position of the contact hole 39b extends over the element isolation region 12b. Therefore, an advantage that an increase in the junction leak can be suppressed can be attained.

Figure 10A:
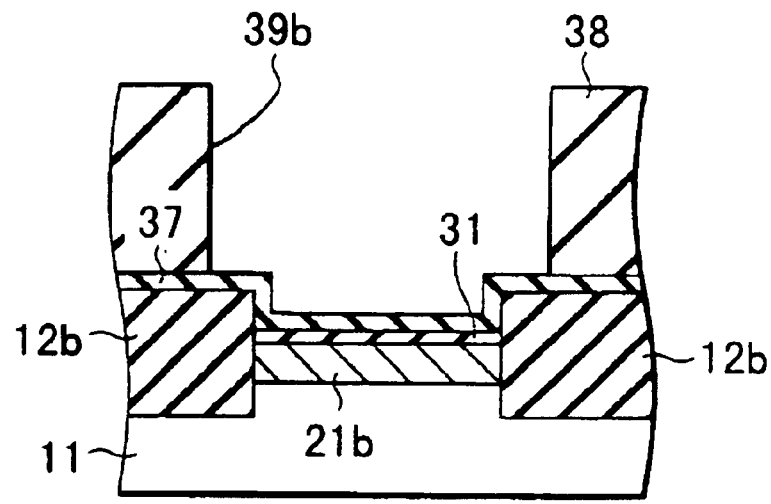
FIGS. 10A and 10B are cross sectional views each showing another example of formation of a contact hole.
Figure 10B:
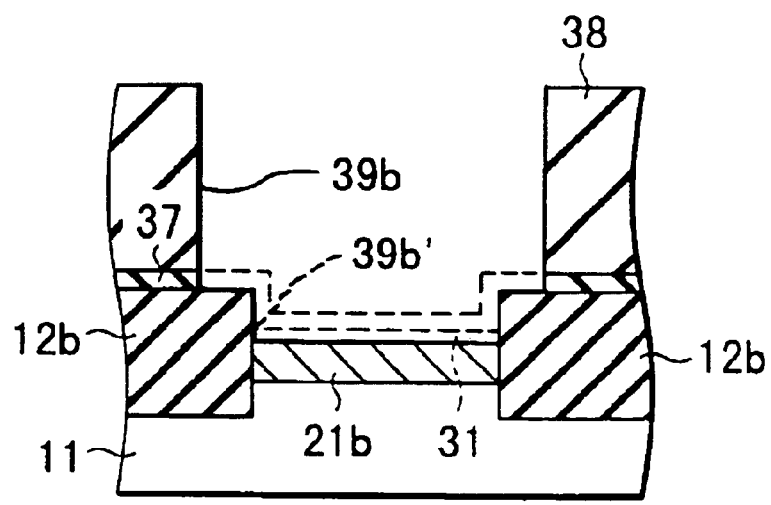

The contact hole 39b may have a diameter larger than the width of the element region as shown in FIGS. 10A and 10B. In this case, the contact hole 29b overlaps the element isolation region 12b.

Figure 11:
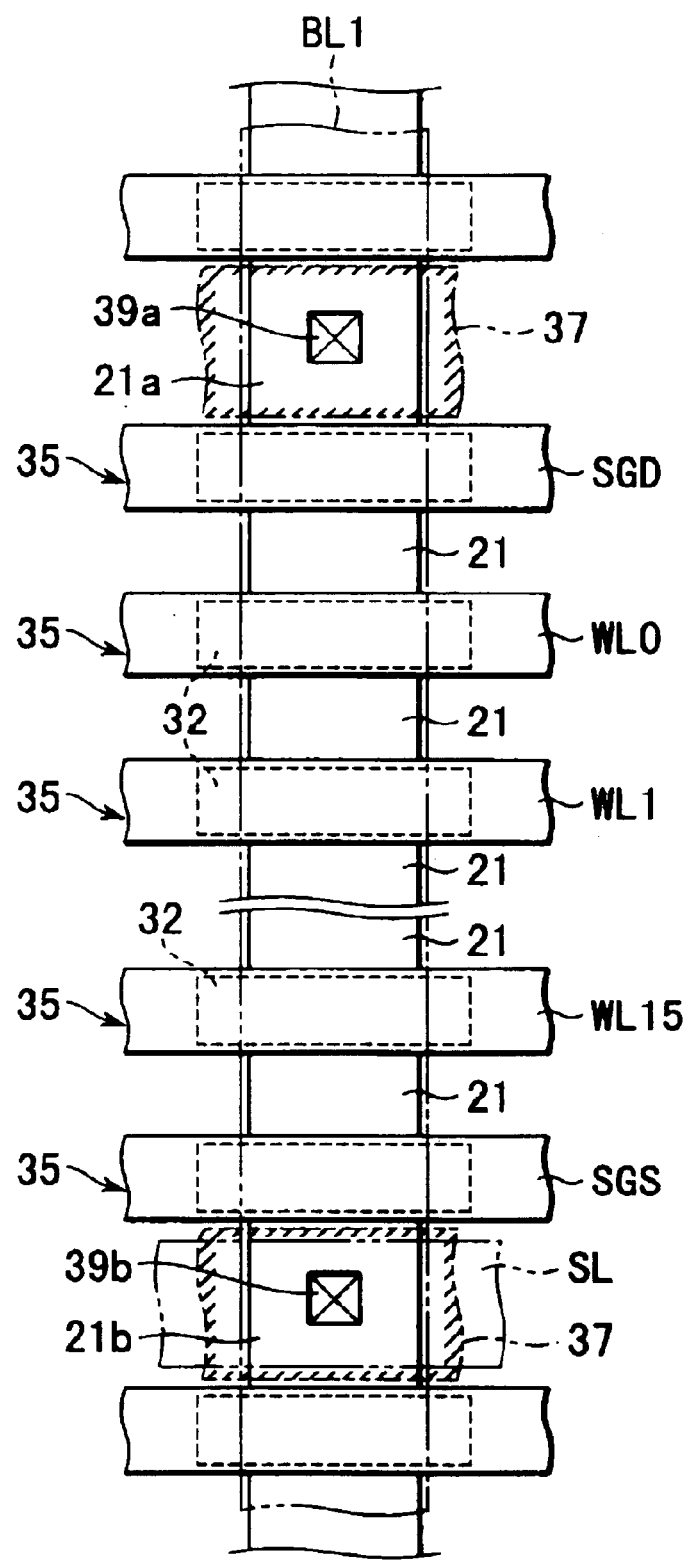
FIG. 11 is a plan view showing a fourth modification of the NAND type EEPROM according to the first embodiment of this invention.

Thus, an increase in the junction leak can be suppressed in the EEPROM having the first insulating film 37 in the memory cell region 12. It is therefore preferable to leave the first insulating film 37 on that part of the diffusion layer in which a contact hole is to be made and a nearby part of the diffusion layer, while any other part of the film 37 is removed after the annealing is effected in the oxidation atmosphere. FIG. 11 is a plan view of an EERROM of this type, which is the fourth embodiment of the invention.

(Fifth Modification of First Embodiment)

Figure 12:
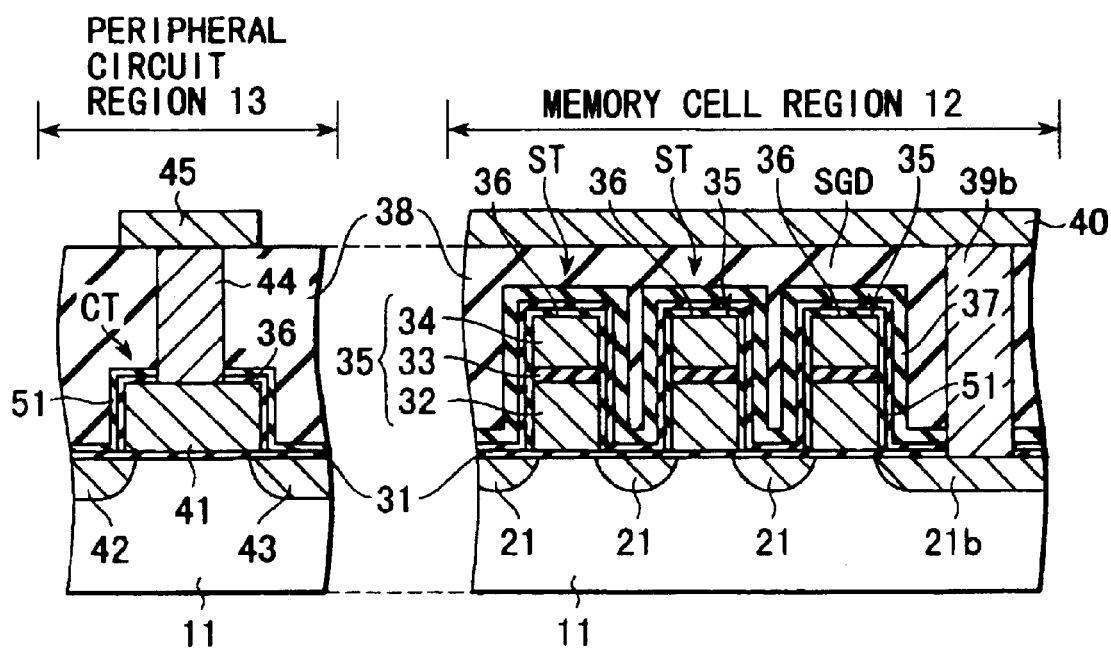
FIG. 12 is a cross sectional view showing a fifth modification of the NAND type EEPROM according to the first embodiment of this invention.

FIG. 12 is a cross sectional view showing a fifth modification of the NAND type EEPROM according to the first embodiment of this invention.

In the first embodiment, the first insulating film 37 is formed on the post-oxidation film 36, but this is not limitative. For example, as shown in FIG. 12, a second insulating film 51 such as a silicon dioxide film (which is also called a TEOS film) which permits an oxidizing agent to pass therethrough and is formed by using material gas of TEOS (Tetra Epoxy Silane) may be formed between the post-oxidation film 36 and the first insulating film 37.

In this case, for example, since the second insulating film 51 functions as a stopper when the first insulating film 37 is removed, the process margin can be enlarged.

(Second Embodiment)

In a case where a silicon nitride film is used as a first insulating film 37, there occurs a possibility that the reliability of the tunnel oxide film of a memory cell will be lowered since the silicon nitride film contains a relatively large amount of hydrogen and it has relatively large mechanical film stress.

In this case, hydrogen can be extracted from the silicon nitride film and the film quality can be improved by subjecting the structure to the annealing process after deposition of the silicon nitride film in the oxidation atmosphere. Therefore, the effect for suppressing a lowering in the reliability of the tunnel oxide film of the memory cell can be sufficiently expected.

Figure 13:
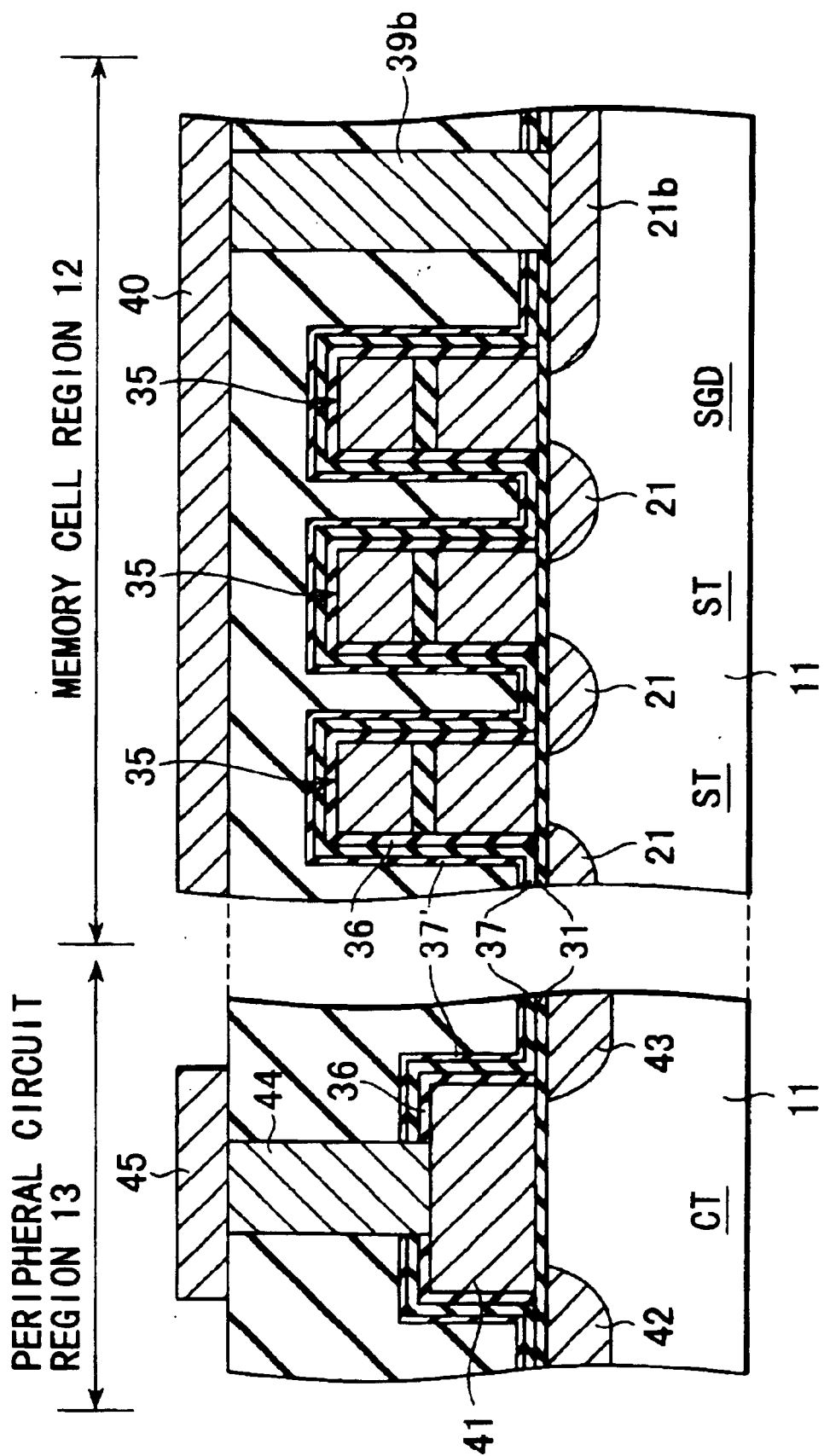
FIG. 13 is a cross sectional view showing a NAND type EEPROM according to a second embodiment of this invention.

FIG. 13 is a cross sectional view showing a NAND type EEPROM according to a second embodiment of this invention. Further, FIGS. 14A, 14B, 14C, 14D are cross sectional views showing the NAND type EEPROM of the second embodiment of this invention in the respective main manufacturing steps.

The second embodiment will be explained together with the manufacturing method thereof.

Figure 14A:
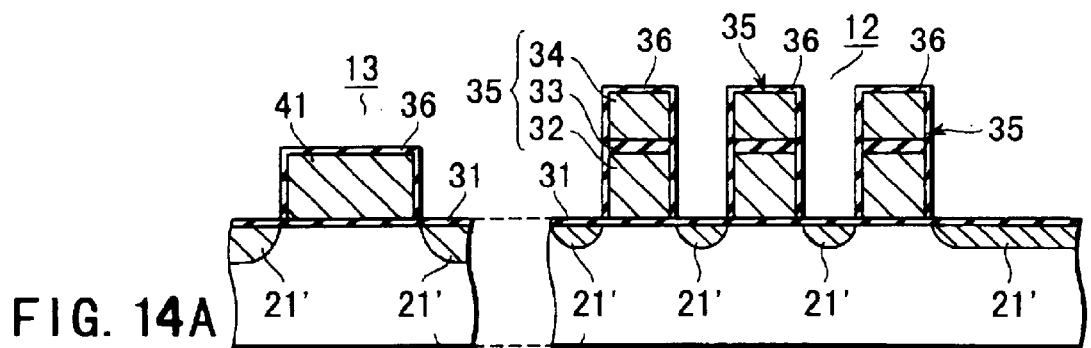
FIGS. 14A, 14B, 14C and 14D are cross sectional views showing the NAND type EEPROM according to the second embodiment of this invention in the respective main manufacturing steps.

First, as shown in FIG. 14A, a silicon substrate 11 (or well region) is subjected to the thermal oxidation process to form a gate oxide film (tunnel oxide film) 31 by the same method as that explained with reference to FIG. 5A. Then, gate electrodes 35 of stacked gate structure are formed on the gate oxide film 31 in a memory cell region 12 and gate electrodes 41 of single-gate structure are formed on the gate oxide film 31 in a peripheral circuit region 13. After this, the surfaces of the gate electrodes 35, 41 are subjected to the oxidation process. The oxidation process is effected to compensate for the processing damage of the gate electrodes 35, 41, and as the result of the oxidation process, post-oxidation films 36 are formed on the surfaces of the gate electrodes 35, 41. Next, impurity 21' is ion-implanted into the silicon substrate 11 (or well region) with the gate electrodes 35, 41 and the element isolation region 12b used as a mask.

Figure 14B:
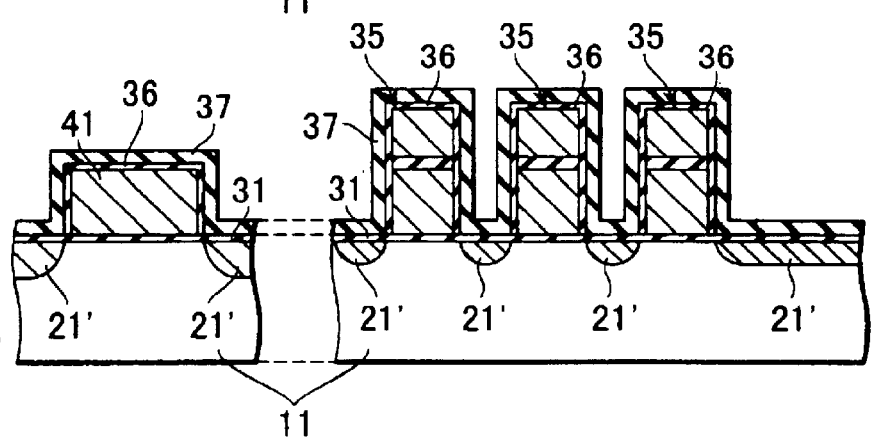

As shown in FIG. 14B, a silicon nitride film 37 is deposited on the structure shown in FIG. 14A by the same method as explained with reference to FIG. 5B. It is desired that the silicon nitride film 37 have a thickness of 50 nm or less.

Figure 14C:
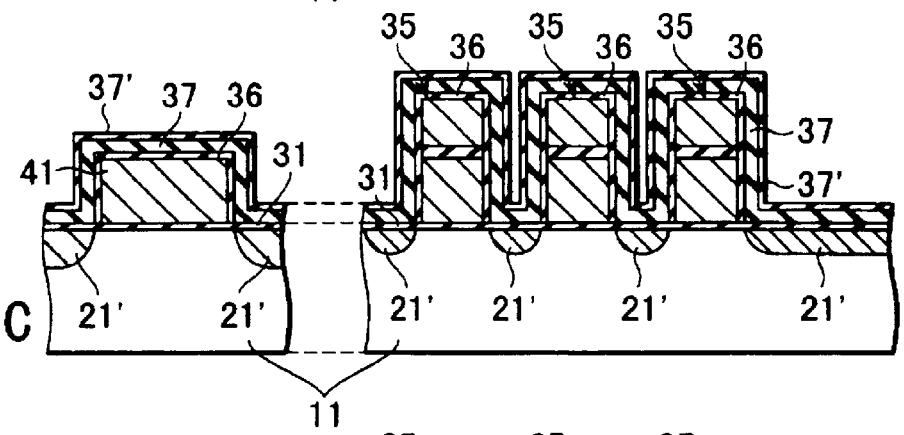

Then, as shown in FIG. 14C, the doped impurity 21' is activated by effecting the annealing process in an oxidation atmosphere. In this case, the silicon nitride film 37 is subjected to the oxidation process to form a surface oxide film 37'. The surface oxide film 37' is so formed as to have a thickness of, for example, 1 nm to 10. nm. It is desired that the surface region of the silicon nitride film 37 be oxidized by strong oxidation, such as pyrogenic oxidation, water-vapor oxygen oxidation, ozone oxidation or oxygen-radical oxidation. This is because strong oxidation can efficiently extract hydrogen from the silicon nitride film 37.

The silicon nitride film 37 on which the surface oxide film 37' is formed has a concentration gradient in which the hydrogen concentration gradually becomes higher from the surface side.

Thus, an influence by the hydrogen in the silicon nitride film 37 on the gate oxide film (tunnel oxide film) 31 is reduced and then the impurity 21' is laterally diffused towards portions below the gate electrodes 35, 41.

Figure 14D:
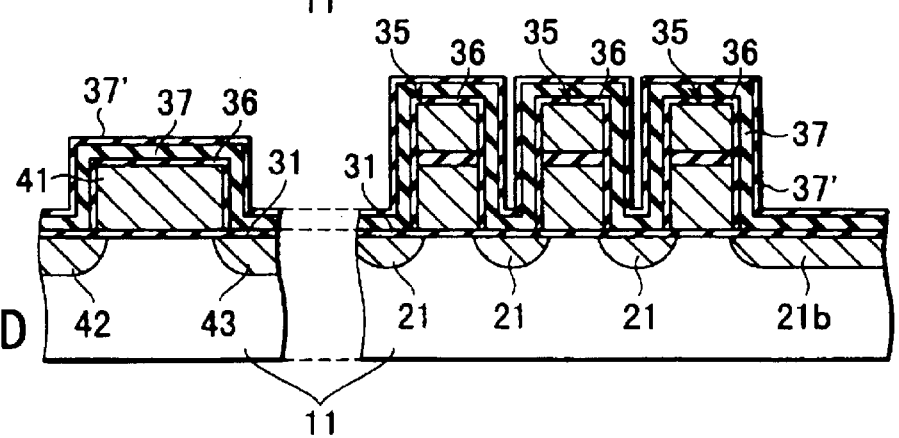

As a result, as shown in FIG. 14D, diffusion layers 21, 21a, 21b, 42, 43 are formed.

Next, after an inter-level insulating film 38 is formed on the structure shown in FIG. 14D, contacts 44 and interconnection layers 45 connected to the gate electrodes 41 are formed, contacts 39b and bit lines 40 connected to the drain diffusion layers 21b are formed, and contacts 39a and source lines connected to the source diffusion layers 21a are formed. Thus, a NAND type EEPROM with the construction shown in FIG. 12 is completed.

For example, as shown in FIG. 15, the hydrogen concentration of the silicon nitride film can be lowered and an electron trap amount dVg in the gate oxide film (tunnel oxide film) 31 can be reduced by forcedly forming the surface oxide film 37' on the surface of the silicon nitride film 37.

That is, if the surface of the silicon nitride film 37 is subjected to the oxidation process before deposition of the inter-level insulating film 38, the hydrogen concentration of the silicon nitride film 37 can be lowered and the hydrogen concentration of the thermal oxide film 31 can be lowered. As a result, the electron trap amount dVg in the gate oxide film (tunnel oxide film) 31 can be reduced and the reliability of the tunnel oxide film can be prevented from being lowered.

The hydrogen concentration of the thermal oxide film shown in FIG. 15 is expressed by a relative value when it is set at "1" when the surface oxide film 37' is not formed.

Further, for example, the electron trap amount dVg is a difference between the maximum value and minimum value of the gate voltage occurring in a period 20 seconds when a negative voltage is applied to the gate and a D.C. constant current of approx. 0.1 A/cm$^2$ is caused to flow in the tunnel oxide film for approx. 20 seconds. In this case, the value of dVg becomes larger as the generation amount of electron trap in the tunnel oxide film becomes larger.

With the above construction, the reliability of the gate oxide film (tunnel oxide film) 31 can be suppressed or prevented from being lowered even if the silicon nitride film 37 is left behind on the memory cell region 12.

In the second embodiment, the silicon nitride film 37 is left behind on the peripheral circuit region 13, and it is possible to leave the silicon nitride film at least on the memory cell region 12 as in the first embodiment. In this case, in addition to the effect that the hydrogen concentration of the silicon nitride film 37 can be lowered, an advantage that the overlap amount or the like of the diffusion layer can be made different in the peripheral transistor and in the cell transistor can be attained.

In the second embodiment, the impurity 21' is doped into the substrate 11 before the silicon nitride film 37 is formed, but this is not limitative. For example, it is possible to dope the impurity 21' into the substrate 11 after the silicon nitride film 37 is formed.

The silicon nitride film 37 is not always necessary after the annealing process is effected in the oxidation atmosphere. Therefore, it is possible to remove all of the silicon nitride film 37 after the annealing process.

Further, this invention is not limited to the NAND type EEPROM and can be applied to an EEPROM other than the NAND type EEPROM, for example, an AND type EEPROM shown in FIG. 16A, NOR type EEPROM shown in FIG. 16B.

In the first and second embodiments, the post-oxidation film 36 is provided on the upper surface of the control gate electrode 34 of stacked gate structure or on the upper surface of the gate electrode 41 of single-gate structure. Nonetheless, the control gates 34 and 41 may each comprise a conductive strip and either a silicon oxide film or silicon nitride film, which is provided on the conductive strip. In this case, the post-oxidation film 36 is provided on only the sides of the control gate electrode 34 or only the sides of the gate electrode 41.

In addition, this invention can be variously modified without departing from the technical scope thereof.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device, comprising:

a semiconductor substrate having a peripheral circuit region and a memory cell region;

a first element region provided in the memory cell region;

a second element region provided in the peripheral circuit region;

a memory cell having source and drain diffusion layers each provided in the first element region;

a peripheral transistor having source and drain diffusion layers each provided in the second element region;

an element isolation region being in contact with the first element region;

an insulating film covering the memory cell, the peripheral transistor, and the element isolation region, and containing an insulator different from the element isolation region, the insulating film being harder for an oxidizing agent to pass therethrough, compared with a silicon oxide film, and a surface of the insulating film being oxidized;

an inter-level insulating film provided on the surface of the insulating film, the inter-level insulating film containing an insulator different from the insulating film;

a contact hole provided in the inter-level insulating film and the insulating film, the contact hole reaching at least one of the source and drain diffusion layers of the memory cell and overlapping the element isolation region; and a contact plug provided in the contact hole, the contact plug being in contact with at least one of the source and drain diffusion layers of the memory cell, the insulating film, and the inter-level insulating film.

2. The device according to claim 1, wherein surfaces of gate electrodes of the memory cell and the peripheral transistor are oxidized.

3. The device according to claim 1, wherein the insulating film has a thickness of at most 50 nm.

4. The device according to claim 1, wherein the insulating film includes a silicon nitride film.

5. The device according to claim 4, wherein a surface of the silicon nitride film is oxidized.

6. The device according to claim 5, wherein a thickness of an oxidized region of the silicon nitride film is at least 1 nm and at most 10 nm.

7. The device according to claim 4, wherein the silicon nitride film contains hydrogen, and a concentration of the hydrogen is at most $3\times10^{21}$ atom/cm$^3$.

8. The device according to claim 4, wherein the silicon nitride film contains hydrogen, and a concentration of the hydrogen gradually becomes higher from the surface of the silicon nitride film.

9. The device according to claim 1, wherein a gate electrode of each of the memory cell the peripheral transistor contains a metal or a metal silicide.

10. The device according to claim 9, wherein the metal contains tungsten.

11. The device according to claim 1, wherein a gate electrode of each of the memory cell and the peripheral transistor is a stacked gate structure including a floating gate and a control gate, and the control gate contains a metal or a metal silicide.

12. The device according to claim 11, wherein the metal contains tungsten.

13. The device according to claim 1, wherein a diameter of the contact hole is wider than a width of the first element region.

14. The device according to claim 1, wherein the memory cell constructs a NAND EEPROM.

15. A nonvolatile semiconductor memory device, comprising:

a semiconductor substrate having a peripheral circuit region and a memory cell region;

a first element region provided in the memory cell region;

a second element region provided in the peripheral circuit region;

a plurality of memory cells and a selection transistor each having source and drain diffusion layers each provided in the first element region;

a peripheral transistor having source and drain diffusion layers each provided in the second element region;

an element isolation region being in contact with the first element region;

an insulating film covering the plurality of memory cells, the selection transistor, the peripheral transistor, and the element isolation region and containing an insulator different from the element isolation region, the insulating film being harder for an oxidizing agent to pass therethrough, compared with a silicon oxide film, and a surface of the insulating film being oxidized;

an inter-level insulating film provided on the surface of the insulating film, the inter-level insulating film containing an insulator different from the insulating film;

a contact hole provided in the inter-level insulating film and the insulating film, the contact hole reaching at least one of the source and drain diffusion layers of the selection transistor and overlapping the element isolation region; and a contact plug provided in the contact hole, the contact plug being in contact with at least one of the source and drain diffusion layers of the selection transistor, the insulating film, and the inter-level insulating film.

16. The device according to claim 15, wherein a diameter of the contact hole is wider than a width of the first element region.

17. The device according to claim 15, wherein surfaces of gate electrodes of the memory cells, the selection transistor, and the peripheral transistor are oxidized.

18. The device according to claim 15, wherein the insulating film has a thickness of at most 50 nm.

19. The device according to claim 15, wherein the insulating film includes a silicon nitride film.

20. The device according to claim 19, wherein a surface of the silicon nitride film is oxidized.

21. The device according to claim 20, wherein a thickness of an oxidized region of the silicon nitride film is at least 1 nm and at most 10 nm.

22. The device according to claim 19, wherein the silicon nitride film contains hydrogen, and a concentration of the hydrogen is at most $3 \times 10^{21}$ atom/cm$^3$.

23. The device according to claim 19, wherein the silicon nitride film contains hydrogen, and a concentration of the hydrogen gradually becomes higher from the surface of the silicon nitride film.

24. The device according to claim 15, wherein a gate electrode of each of the memory cells, the selection transistor, and the peripheral transistor contains a metal or a metal silicide.

25. The device according to claim 24, wherein the metal contains tungsten.

26. The device according to claim 15, wherein a gate electrode of each of memory cells, the selection transistor, and the peripheral transistor is a stacked gate structure including a floating gate and a control gate, and the control gate contains a metal or a metal silicide.

27. The device according to claim 26, wherein the metal contains tungsten.

28. The device according to claim 15, wherein the memory cells construct a NAND EEPROM.

* * * * *